(12) United States Patent  
Gan

(10) Patent No.: US 6,487,070 B2  
(45) Date of Patent: Nov. 26, 2002

(54) COMPUTER ENCLOSURE INCORPORATING FASTENER

(75) Inventor: Li Yuan Gan, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/755,332

(22) Filed: Jan. 5, 2001

(65) Prior Publication Data

US 2001/0053060 A1 Dec. 20, 2001

(30) Foreign Application Priority Data

May 30, 2000 (TW) ........................................ 89209215 U

(51) Int. Cl.[7] ................................................ G07G 1/16
(52) U.S. Cl. ........................ 361/683; 361/748; 361/752; 361/785; 312/223.1
(58) Field of Search ........................ 361/748, 752–756, 361/759, 785–788, 796, 801–804, 683; 312/223.1–223.3

(56) References Cited

U.S. PATENT DOCUMENTS 6,231,139 B1 * 5/2001 Chen ........................ 312/223.2

* cited by examiner

Primary Examiner—Darren Schuberg  
Assistant Examiner—Yean-Hsi Chang  
(74) Attorney, Agent, or Firm—Wei Te Chung

(57) ABSTRACT

A computer enclosure includes a rear panel (20) and a fastener (40) detachably and rotatably mounted to the rear panel. The rear panel defines a plurality of parallel slots (23) for receiving expansion cards (80). A pair of limbs (25) is formed on the rear panel for locking the fastener in place. The rear panel forms semi-circular pivots (21) to which the fastener is pivotally attached. The fastener is thus rotatably movable between a first position and a second position during assembly. When located at the first position, the fastener does not engage with the covers, thereby allowing the expansion card covers to be attached to or detached from the rear panel. When located at the second position, the fastener is secured to the rear panel by the limbs, and engages with the covers.

10 Claims, 8 Drawing Sheets

COMPUTER ENCLOSURE INCORPORATING FASTENER

BACKGROUND

1. Field of the Invention

The present invention relates to a computer enclosure, and particularly to a computer enclosure incorporating a pivotable fastener for facilitating attachment of expansion cards to the computer enclosure.

2. The Related Art

A common computer comprises a plurality of expansion slots in a mother board thereof, for receiving expansion cards to expand the functions thereof. Accordingly, such computer enclosure requires a plurality of slots for providing access to the expansion cards. Conventionally, expansion cards are secured in a computer enclosure one by one, using bolts. This procedure is complicated and time-consuming.

To solve the above problem, referring to FIG. 8, Taiwan Patent Application No. 88201721 discloses a computer enclosure 100 including a rear panel 102 and a fixing cover 104 attached to the rear panel 102. The fixing cover 104 secures the expansion cards 106 to the rear panel 102 all together. However, the fixing cover 104 is secured to the rear panel 102 by bolts 108. This assembly procedure is still complicated and time-consuming.

It is desired to attach expansion cards to a computer enclosure without bolts.

SUMMARY OF THE INVENTION

Accordingly, an object of the present invention is to provide a computer enclosure having a fastener which facilitates attaching expansion cards to the computer enclosure.

To achieve the above-mentioned object, a computer enclosure in accordance with the present invention comprises a rear panel and a fastener detachably rotatable with respect to the rear panel. The rear panel defines a plurality of parallel slots for receiving the expansion cards. A pair of limbs is formed on the rear panel for locking the fastener in place. The rear panel forms semi-circular pivots to which the fastener is pivotally attached. The fastener is thus rotatably movable between a first position and a second position during assembly. In assembly, each expansion card is attached to its corresponding cover by conventional means. When located at the first position, the fastener does not engage with the covers. This allows the covers to be attached to or detached from the rear panel. When located at the second position, the fastener is secured to the rear panel by the limbs, and engages with the covers. The fastener thereby securely attaches the covers to the rear panel.

Other objects, advantages and novel features of the present invention will be apparent from the following detailed description of preferred embodiments of the present invention with reference to the attached drawings, in which:

DESCRIPTION OF THE PREFERRED EMBODIMENTS

Figure 1:
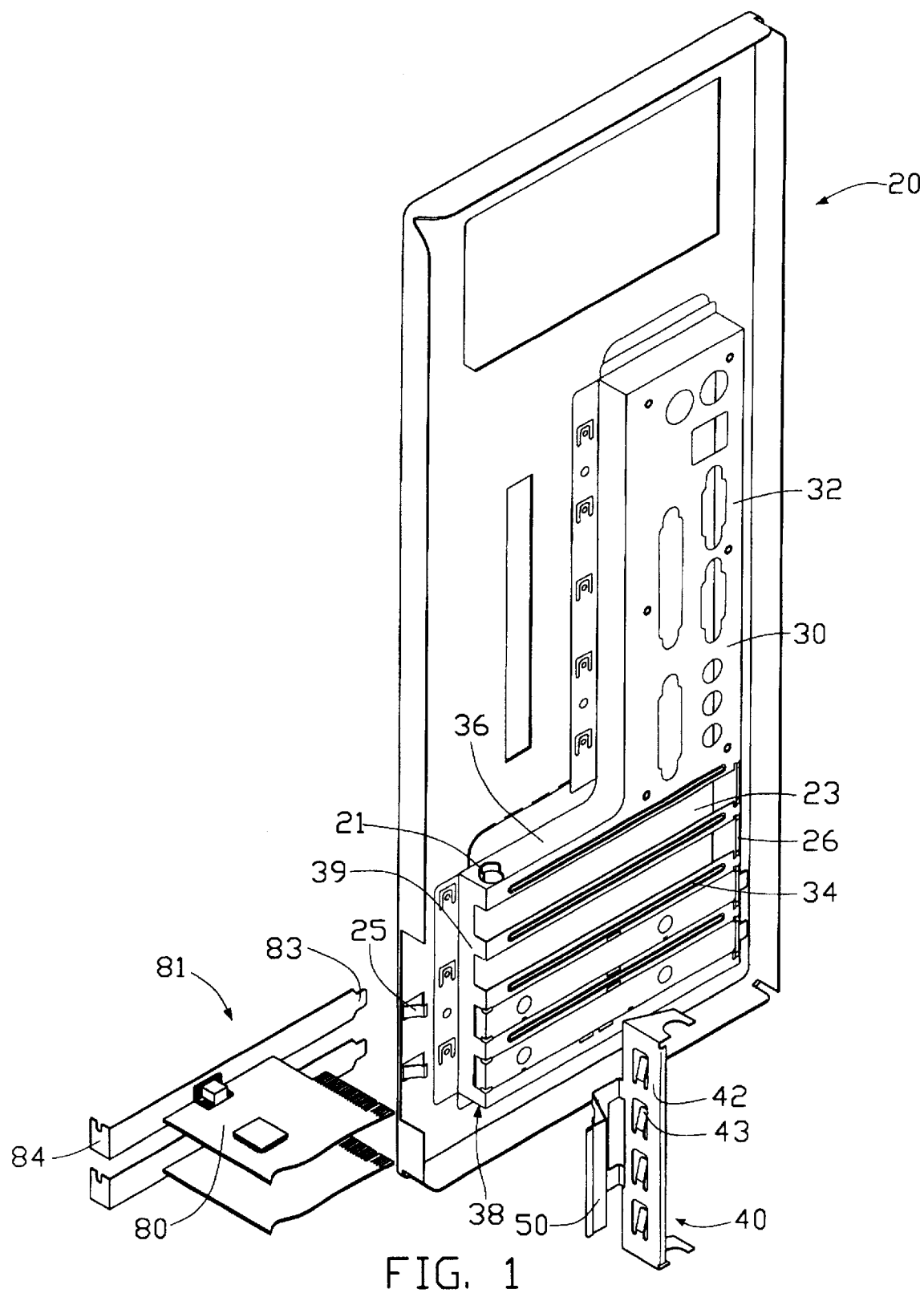
FIG. 1 is an exploded view of a computer enclosure in accordance with the present invention.

Referring to FIG. 1, a computer enclosure in accordance with the present invention comprises a rear panel 20, and a fastener 40 pivotally connected to the rear panel 20 for securing expansion cards 80 thereto.

Each expansion card 80 has an elongated cover 81, a bent portion 84, and a tapering root portion 83. The bent portion 84 extends perpendicularly from an end of the cover 81, and the root portion 83 is located at an opposite end of the cover 81. The rear panel 20 has an L-shaped rear window 30. The rear window 30 includes a vertical portion 32 and a horizontal portion 34. A plurality of parallel expansion card slots 23 are horizontally defined in the horizontal portion 34, for providing access to and receiving expansion cards 80. A slit 26 is defined in the horizontal portion 34 adjacent one longtitudinal end of each expansion card slot 23, for receiving the root portion 83 of each respective expansion card 80. A pair of semicircular pivots 21 respectively protrudes from a top wall 36 and a bottom wall 38 of the horizontal portion 34, for pivotally engaging with the fastener 40. A pair of limbs 25 with pliable round ends extends inwardly from the rear panel 20 adjacent a left side wall 39 of the rear window 30, for resiliently locking the fastener 40.

Figure 2:
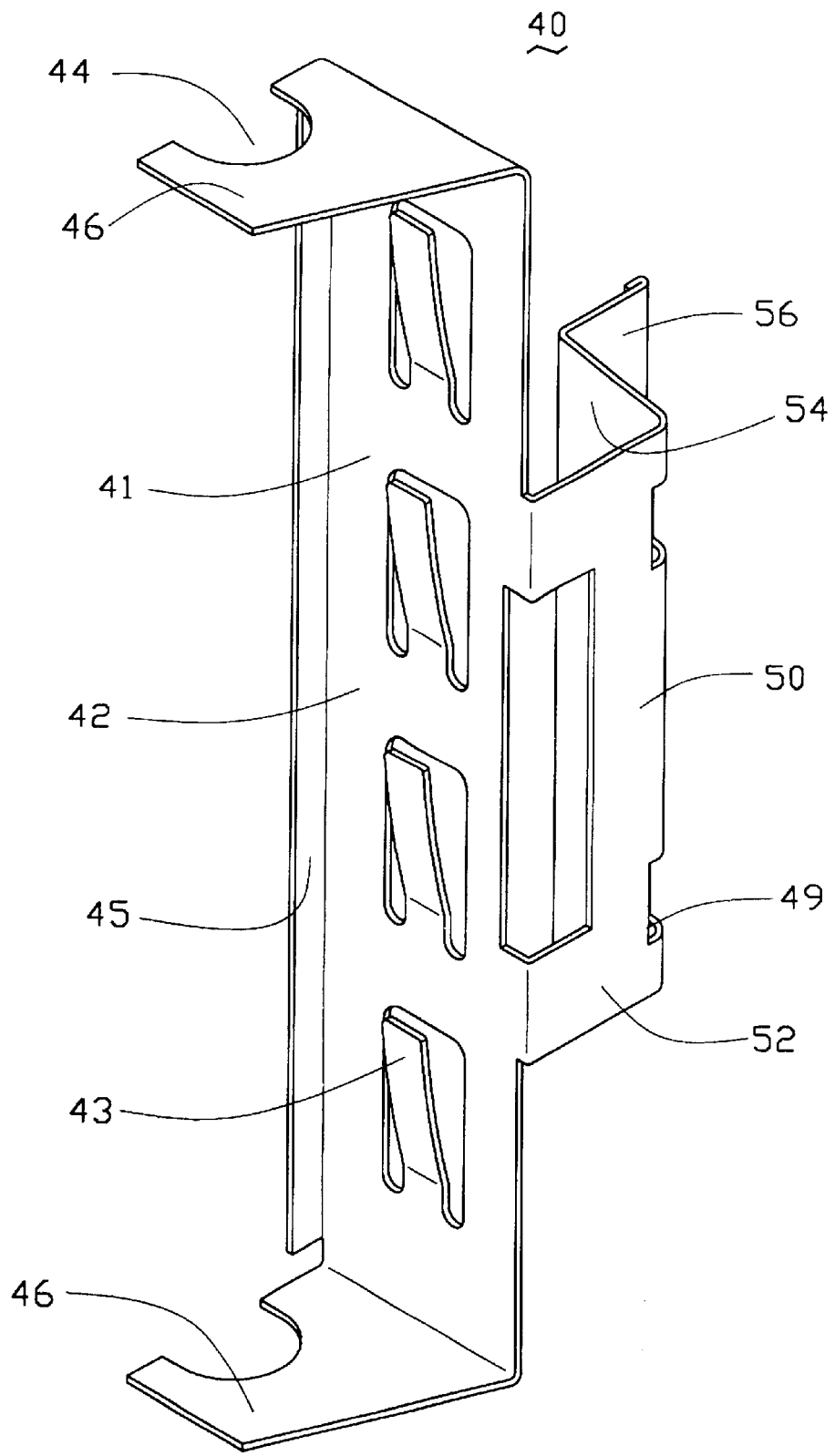
FIG. 2 is a perspective view of a fastener of FIG. 1, but shown from another perspective.

Referring to FIG. 2, the fastener 40 has an U-shaped body 42, and a handle 50 extending perpendicularly from a lateral edge of the body 42 in a first direction. The body 42 has a base 41 with a plurality of resilient fingers 43 protruding at an angle outwardly from the base 41 in a second direction which is opposite to the first direction. The body 42 also has a pair of tabs 46 extending perpendicularly from respective opposite longitudinal ends of the base 41 in the second direction. Each tab 46 defines a semicircular cutout 44 for receiving the corresponding semicircular pivot 21 of the rear panel 20, so as to pivotally connect the fastener 40 to the rear panel 20. A flange 45 extends perpendicularly in the second direction from a lateral edge of the base 41 which is opposite to the lateral edge from which the handle 50 extends The handle 50 includes a first section 52, a second section 54, and a third section 56. The first section 52 extends perpendicularly from a lateral edge of the base 41 in the first direction. The second section 54 extends perpendicularly from a distal lateral edge of the first section 52 such that the second section 54 opposes the base 41. The third section 56 extends outwardly and perpendicularly from a distal lateral edge of the second section 54 in the first direction. The end of the third section 56 of the handle 50 is double folded for facilitating handling. A pair of slots 49 is defined at the junction of the first section 52 and the second section 54, for receiving the fixing portions 25 of the rear panel 20.

Figure 3:
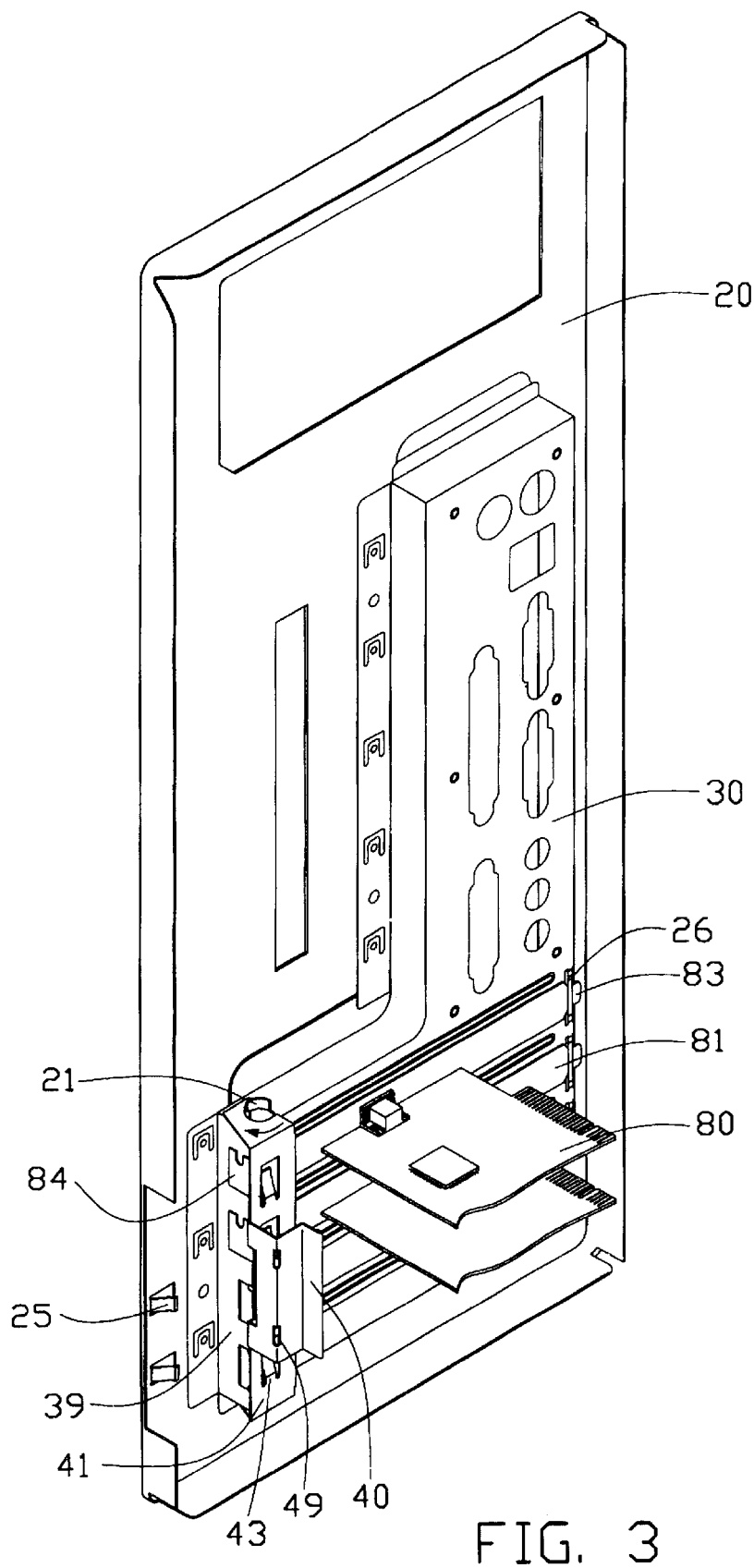
FIG. 3 is an assembled view of FIG. 1 showing the fastener at a first position.

FIG. 3 shows the fastener at a first position in assembly. Each expansion card 80 has been attached to its corresponding cover 81 by conventional means. Each cover 81 is placed in an expansion card slot 23, with the root portion 83 inserted into the slit 26 and the bent portion 84 abutting the left side wall 39. The fastener 40 is mounted on the rear panel 20, with the cutouts 44 of the tabs 46 pivotally engaging with the semicircular pivots 21 of the rear panel 20. The base 41 of the fastener 40 confronts the covers 81.

Figure 4:
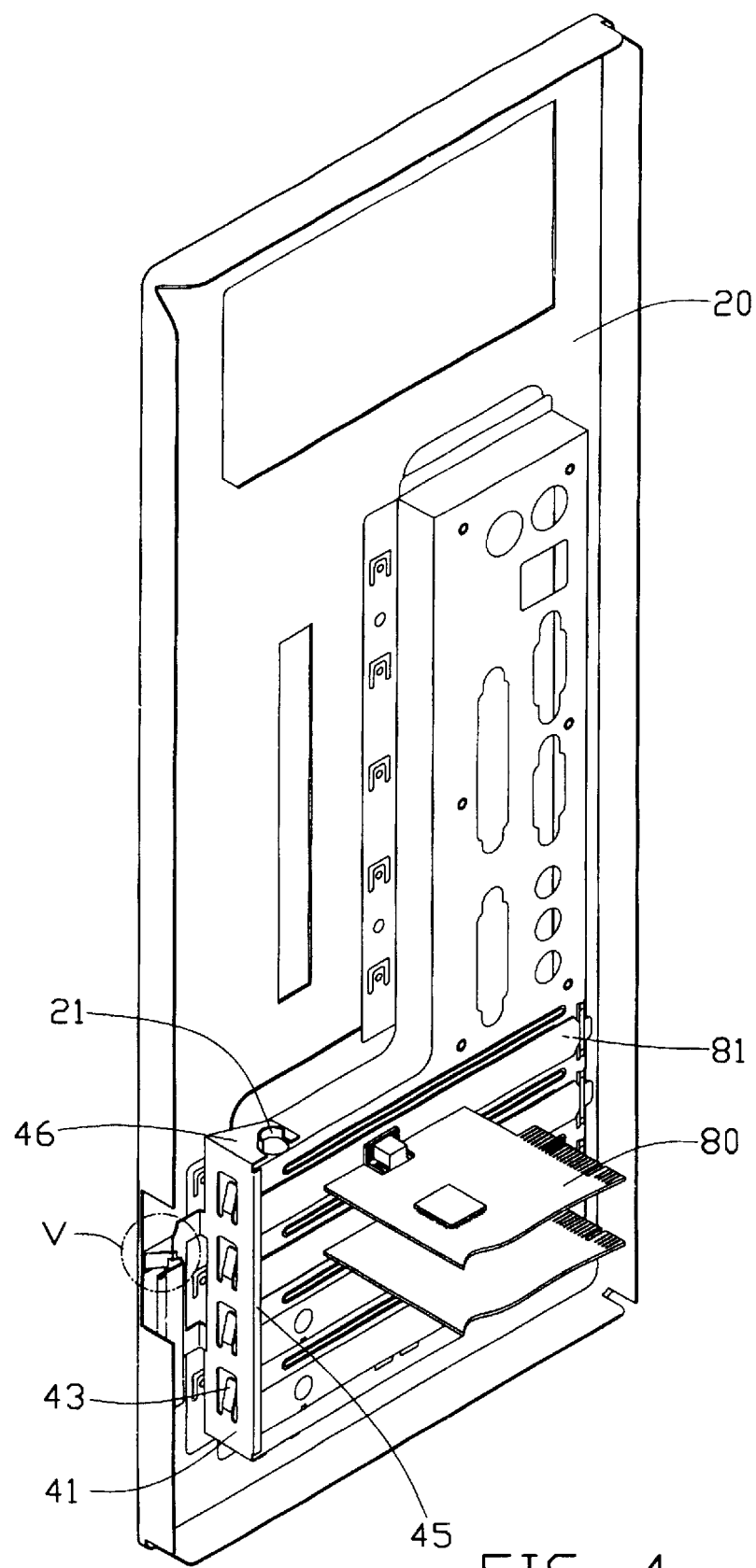
FIG. 4 is similar to FIG. 3, but showing the fastener at a second position, a small portion of the fastener being cut away.
Figure 5:
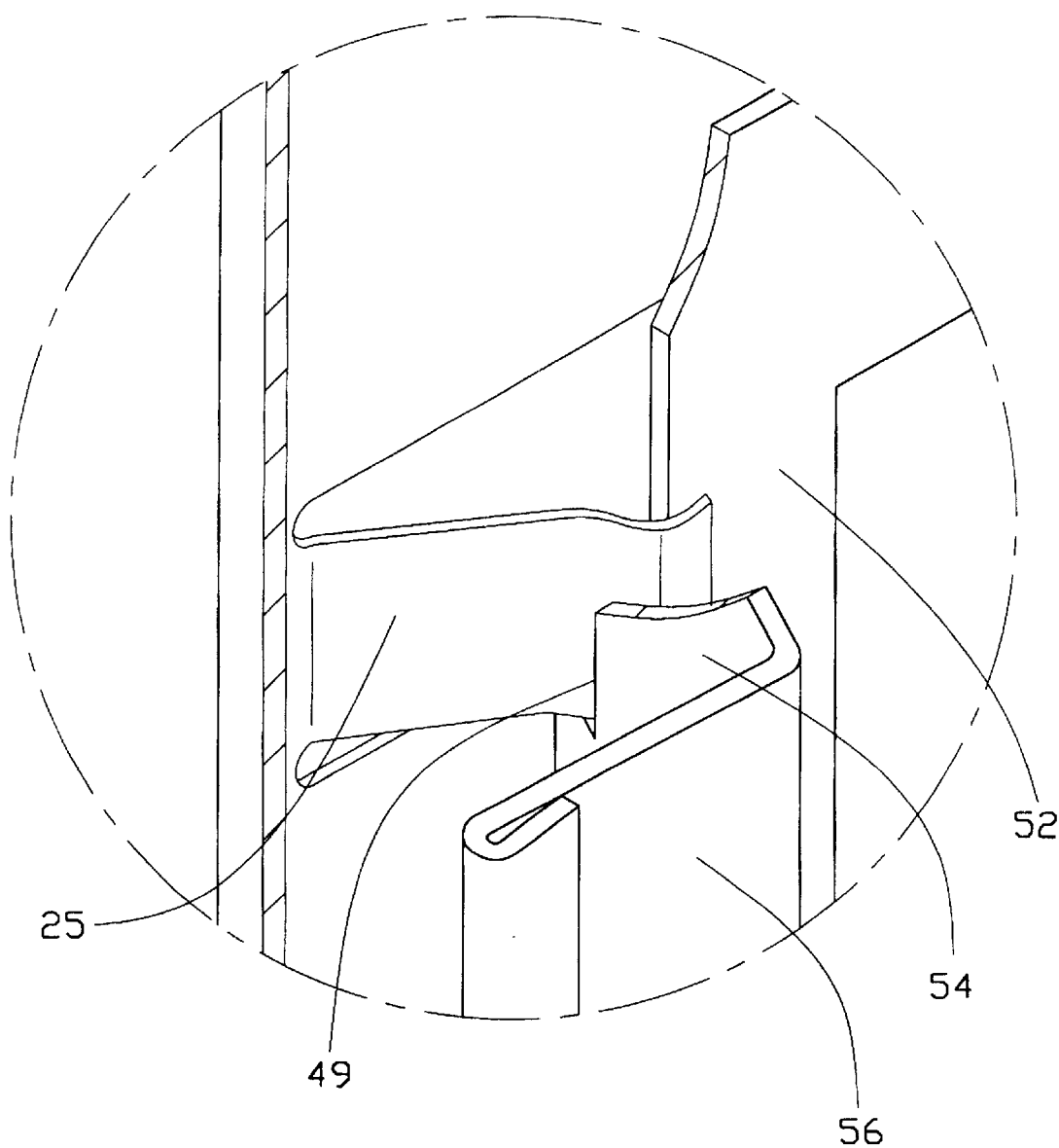
FIG. 5 is an enlarged view of the encircled portion V of FIG. 4.

Then the fastener 40 is rotated to a second position, as shown in FIGS. 4 and 5. The fastener 40 is secured by the limbs 25 of the rear panel 20 extending into the slots 49 of the fastener 40. The base 41 of the fastener 40 confronts the left side wall 39 of the rear window 30, and the resilient fingers 43 press against the bent portions 84 of the covers 81. Additionally, the flange 45 presses the covers 81 against the rear window 30. Thus the fastener 40 securely attaches the expansion cards 80 to the rear panel 20.

Figure 6:
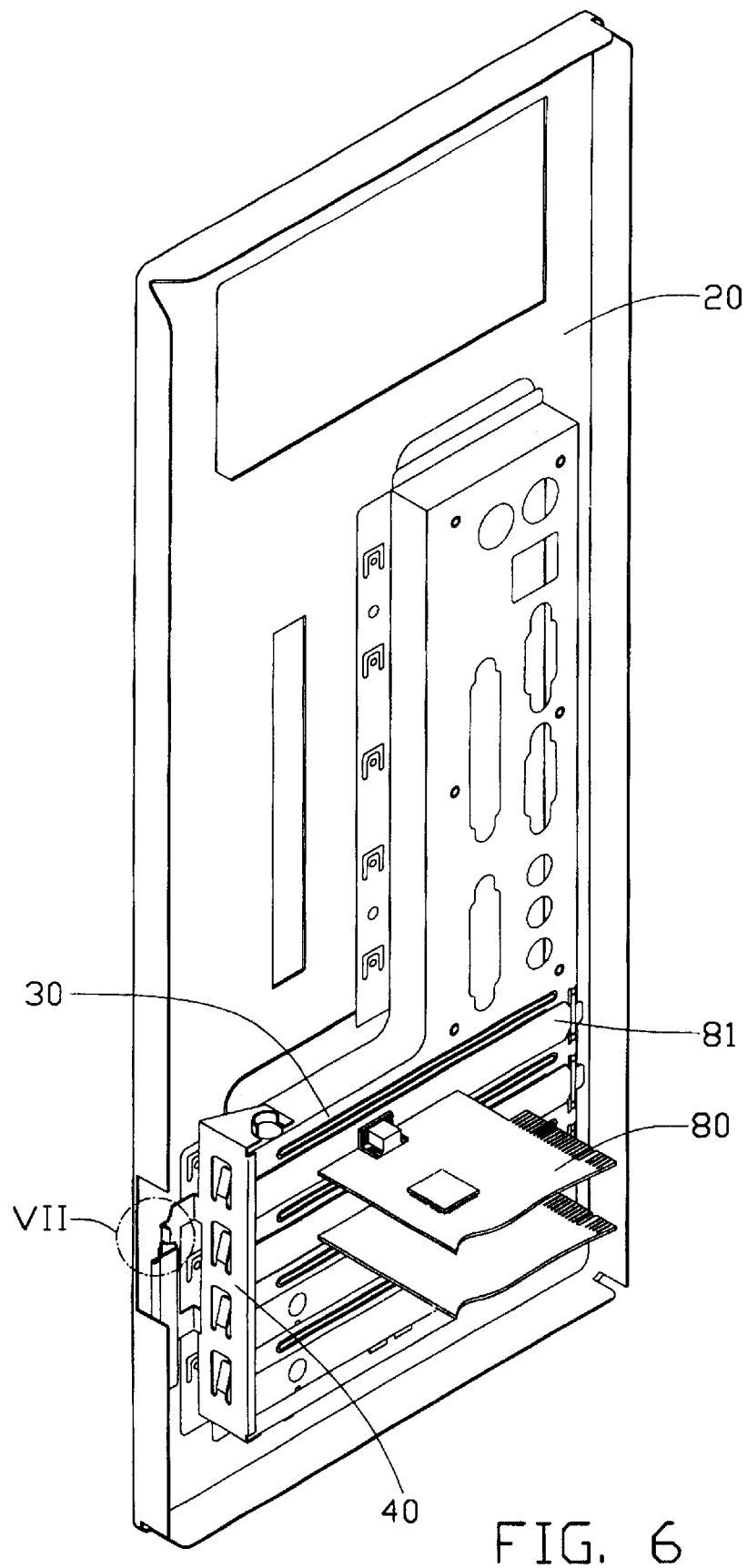
FIG. 6 is similar to FIG. 4, but showing an alternative embodiment of a computer enclosure in accordance with the present invention, a small portion of the fastener being cut away.
Figure 7:
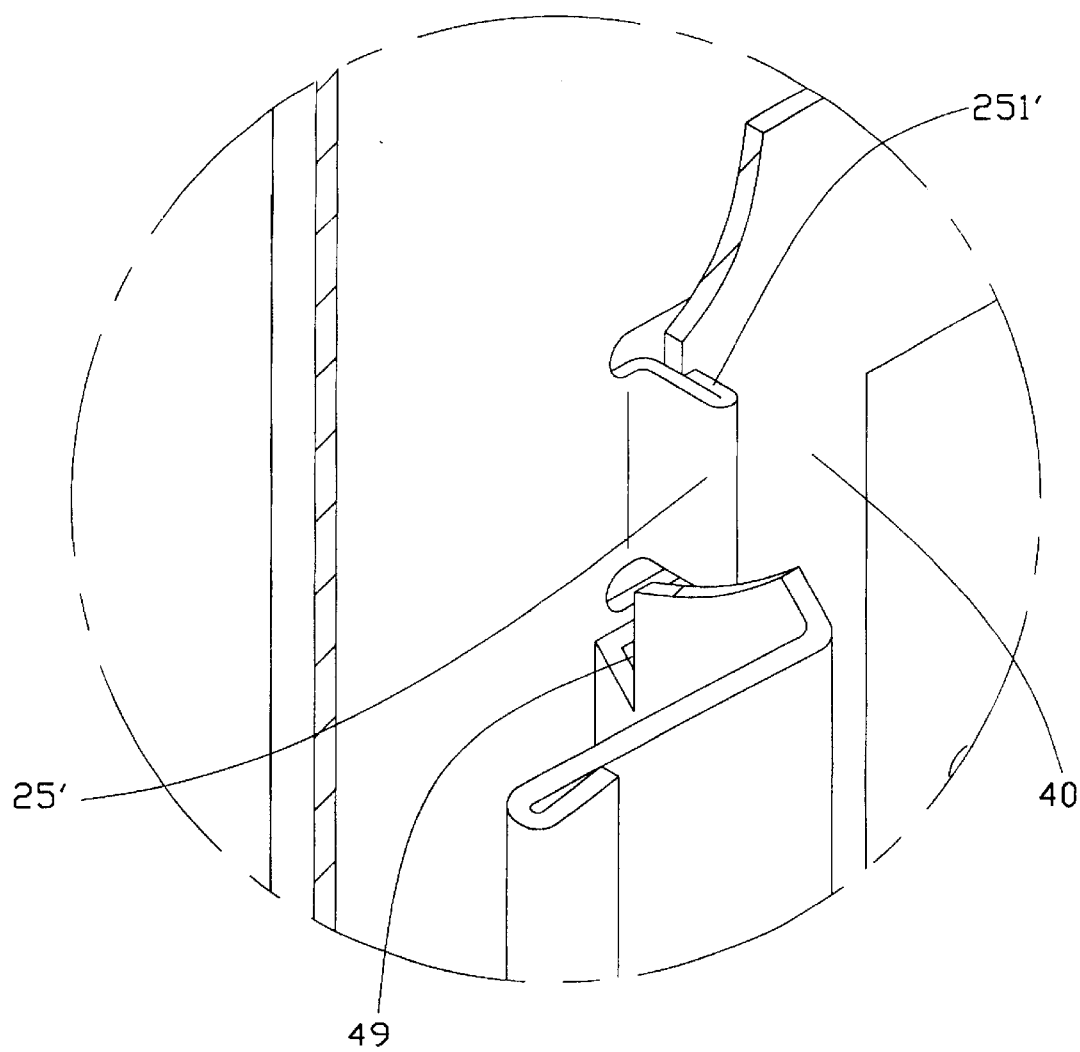
FIG. 7 is an enlarged view of the encircled portion VII of FIG. 6.
Figure 8:
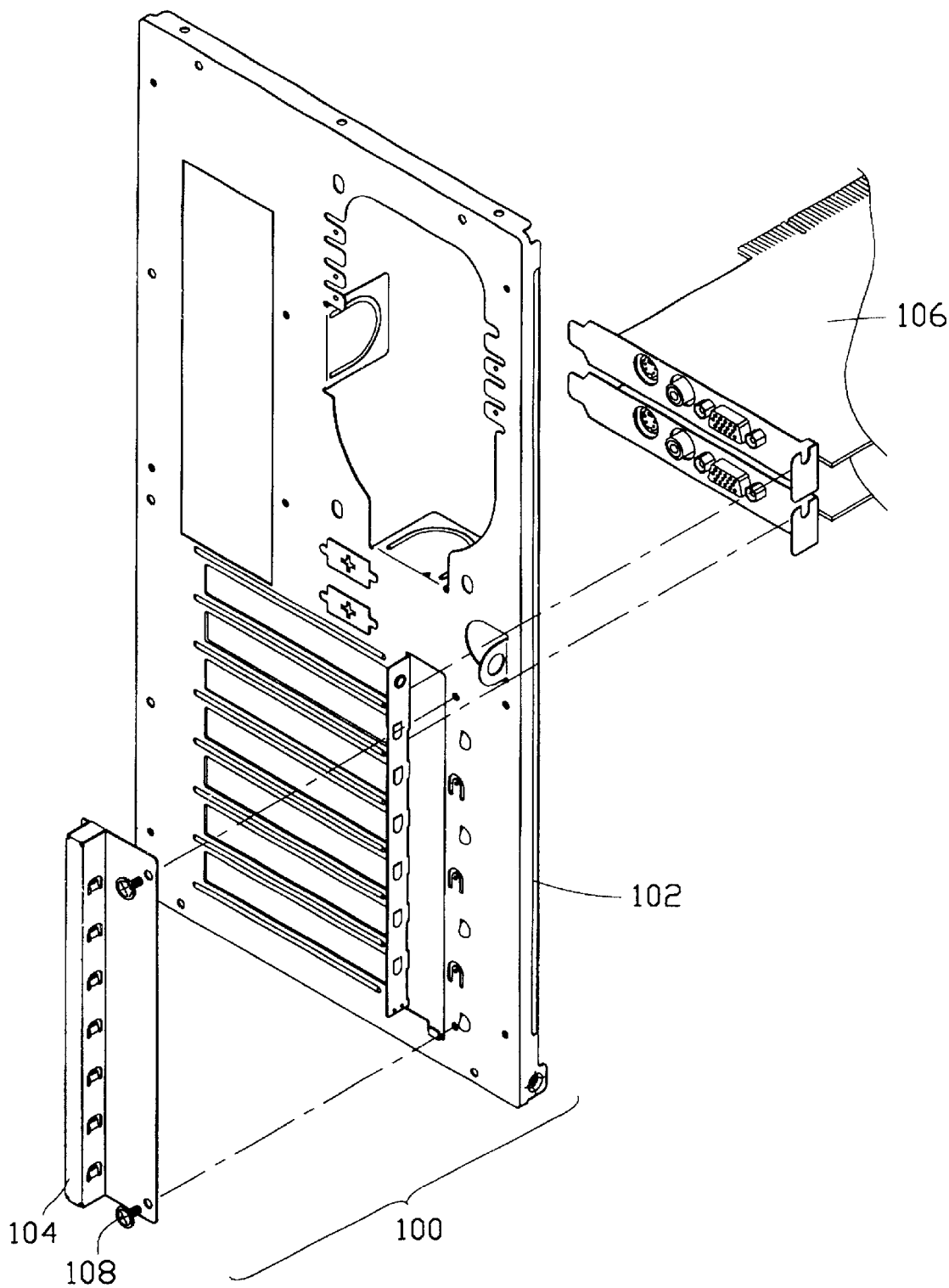
FIG. 8 is an exploded view of a conventional computer enclosure.

Referring to FIGS. 6 and 7, a second embodiment of a computer enclosure in accordance with the present invention is shown. A pair of limbs 25' extends inwardly from the rear panel 20 adjacent the left side wall 39 of the rear window 30, for resiliently locking the fastener 40. A hook 251' is formed at a distal end of each limb 25'. Each limb 25' interengages with the slot 49, locking the fastener 40 in place, as shown in FIG. 7.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A computer enclosure comprising:
   a panel comprising at least a card slot, a plurality of internal pivots, and at least an internal limb integrally extending therefrom;
   at least an expansion card, each having a cover received in and covering the at least a card slot of the panel; and
   at least a fastener pivotally attached to the pivots of the panel and rotatably movable between a first position and a second position; wherein when located at the first position, the fastener does not engage with the at least a cover for allowing each cover to be attached to or detached from the panel, and when located at the second position, the fastener is secured to the panel by the at least a limb and engages with all expansion card covers thereby securely attaching all covers to the panel;
   wherein the fastener has a body comprising a base for pressing all covers onto the panel;
   wherein a plurality of tabs extends from opposite ends of the base of the fastener, each tab defining a cutout for rotatably engaging with the pivots of the panel whereby the fastener is pivotally connected to the panel;
   wherein the pivots of the panel are semicircular, and wherein the cutouts of the tabs of the fastener are semicircular.

2. The computer enclosure as described in claim 1, wherein the base of the fastener forms at least a resilient finger for pressing all covers onto the panel.

3. The computer enclosure as described in claim 1, wherein each fastener has at least a handle.

4. The computer enclosure as described in claim 3, wherein each handle comprises a first section extending perpendicularly from a lateral edge of the base in a first direction, a second section extending perpendicularly from a distal lateral edge of the first section such that the second section opposes the base, and a third section extending outwardly and perpendicularly from a distal lateral edge of the second section in the first direction.

5. The computer enclosure as described in claim 1, wherein each fastener defines at least a slot for engaging with the at least a limb of the panel.

6. The computer enclosure as described in claim 5, wherein each limb of the panel extends inwardly from the panel and has a pliable round end for extending into the at least a slot of the fastener to lock the fastener to the panel.

7. The computer enclosure as described in claim 5, wherein each limb of the panel extends inwardly from the panel, and forms at least a hook at a distal end of the limb for extending into the slot of the fastener to lock the fastener to the panel.

8. The computer enclosure as described in claim 1, wherein at least a flange extends from a lateral edge of the base of each fastener, for pressing all covers against the panel.

9. A computer enclosure comprising:
   a panel comprising a plurality of slots;
   a plurality of expansion cards having covers received in and covering the corresponding card slots, respectively; and
   at least a fastener having a body comprising a base for pressing all covers onto the panel, the fastener being pivotally connected to the panel, and rotatably movable between a first position and a second position; wherein when located at the first position, the fastener does not engage with the covers for allowing individual cover to be attached to or detached from the panel, and when located at the second position, the fastener is secured to the panel by the at least a limb, which integrally extends from one of the fastener and the panel and be latched to the other of said fastener and the panel, and thus said fastener engages with the expansion card covers thereby securely attaching the covers to the panel.

10. A computer enclosure comprising:
   a panel comprising at least a card slot, a plurality of internal pivots, and at least an internal limb integrally extending therefrom;
   at least an expansion card, each having a cover received in and covering the at least a card slot of the panel; and
   at least a fastener pivotally attached to the pivots of the panel and rotatably movable between a first position and a second position; wherein when located at the first position, the fastener does not engage with the at least a cover for allowing each cover to be attached to or detached from the panel, and when located at the second position, the fastener is secured to the panel by the at least a limb and engages with all expansion card covers thereby securely attaching all covers to the panel;
   wherein each fastener has at least a handle;
   wherein each handle comprises a first section extending perpendicularly from a lateral edge of the base in a first direction, a second section extending perpendicularly from a distal lateral edge of the first section 52 such that the second section 54 opposes the base, and a third section extending outwardly and perpendicularly from a distal lateral edge of the second section in the first direction.

* * * * *